(12) United States Patent
Orsier et al.

(10) Patent No.: US 6,546,801 B2
(45) Date of Patent: Apr. 15, 2003

(54) MICRO-MACHINED MECHANICAL STRUCTURE AND DEVICE INCORPORATING THE STRUCTURE

(75) Inventors: Elisabeth Orsier, Grenoble (FR); Bernard Diem, Echirolles (FR); Hélène Wehbe-Alause, Saint-Marcellin (FR); Olivier Lefort, Valence (FR)

(73) Assignees: Commissariat a l'Energie Atomique, Paris (FR); Thomson CSF, Paris (FR)

( * ) Notice: Subject to any disclaimer, the term of this patent is extended or adjusted under 35 U.S.C. 154(b) by 0 days.

(21) Appl. No.: 09/839,134

(22) Filed: Apr. 23, 2001

(65) Prior Publication Data

US 2002/0011117 A1 Jan. 31, 2002

(30) Foreign Application Priority Data

Apr. 28, 2000 (FR) .............................. 00 05487

(51) Int. Cl.[7] .............................................. G01P 15/00
(52) U.S. Cl. .................................... 73/514.38; 73/514.29
(58) Field of Search ........................ 73/504.04, 504.12, 73/514.01, 514.16, 514.23, 514.24, 514.29, 514.38, 514.37, 514.32, 702, 704, 715, 716–722; 361/283.1, 283.3

(56) References Cited

U.S. PATENT DOCUMENTS 5,025,346 A    6/1991 Tang et al.
5,415,043 A  * 5/1995 Zabler et al. ............ 73/514.38
5,583,291 A  * 12/1996 Gutteridge et al. ...... 73/514.38
5,650,568 A    7/1997 Greiff et al.
5,920,012 A    7/1999 Pinson

FOREIGN PATENT DOCUMENTS

SU              493770        2/1976
WO         WO 95/34798       12/1995

OTHER PUBLICATIONS

G. Mueck, et al., The 8th Internatioanal Conference on Solid–State Sensors and Actuators, and Eurosensors IX, , pp. 562–565, "Observation of Non–Linear Effects in the Resonance Behaviour of a Micromachined Silicon Accelerometer", Jun. 25–29, 1995.

R. Paneva, et al., Sensors and Actuators, vol. 72, pp. 79–87, "Non–Linear Vibration Behavior of Thin Multilayer Diaphragms", 1999.

* cited by examiner

*Primary Examiner*—Helen Kwok
(74) *Attorney, Agent, or Firm*—Oblon, Spivak, McClelland, Maier & Neustadt, P.C.

(57) ABSTRACT

A mechanical structure (100) comprises a moving mass (3) suspended by beams (4, 5, 6, 7) from a fixed frame (2). The structure (100) comprises elongation means (23–26) mechanically connected to each of the beams (4, 5, 6, 7). The elongation means is designed such that the stiffness of the beams (4, 5, 6, 7) varies only little during movement of the moving mass. The structure is characterized in that the response of an elongation means is asymmetric when acting in tension and in compression. The structure is thus made insensitive to accelerations along a direction parallel to the suspension direction.

15 Claims, 7 Drawing Sheets

MICRO-MACHINED MECHANICAL STRUCTURE AND DEVICE INCORPORATING THE STRUCTURE

DESCRIPTION

1. Field of the Invention

The field of the invention is mechanical structures and particularly micro-machined mechanical structures, comprising a moving mass connected by at least one beam with two ends at an anchor point, one of the ends of the beam being connected to the moving mass and the other end being connected to the anchor point. It is also related to a device and particularly a sensor incorporating the structure.

2. State of the Art

Mechanical oscillators exist in which the force applied to a moving mass and the movement of this moving mass are related by a non-linear relation, and in this case the stiffness of a beam coupling the moving mass to a fixed structure of the oscillator is variable as a function of the displacement amplitude of the moving mass. This effect of the variation in the stiffness of the beam is more sensitive when the movement amplitude of the moving mass increases. The induced effect may be sub-linear or supra-linear. The non-linear relation between the force applied to the moving mass and the movement amplitude of the moving mass means that there can be two possible amplitudes of the movement at frequencies close to resonance for a given frequency. Therefore the movement becomes unstable. When a structure is excited close to its resonant frequency, the movement amplitude of the moving mass with respect to the static position of the moving mass is amplified by a factor called the "Q quality factor". This factor is higher when energy losses in the mechanical structure are low. This amplification is used to obtain large oscillation amplitudes with low excitation forces. The mechanical transfer function (movement as a function of the excitation frequency) becomes asymmetric close to the resonant frequency and then becomes unstable. The non-linearity phenomenon of the relation between the force applied to the moving mass and the movement amplitude of the moving mass limits the amplitude of the movement that can be accepted if the movement is to be remain stable. For example, silicon micro-structures are observed with built in-built in type beams with a length of a few hundred $\mu$m, for which the oscillation becomes unstable for movement amplitudes of a few $\mu$m. This limits important performances for some systems, for example the sensitivity of a measurement device in which such a structure is used. In order to limit the non-linearity phenomenon, attempts have been made to limit the oscillation amplitude of the moving mass. Thus, the system remains within the linear range and a stable movement is possible. Thus, patent DE-202 445 2 B granted to IBM Corp. describes a monolithic electromechanical oscillator comprising a semi-conducting part for which the mechanical resonant frequency determines the oscillation frequency. An oscillation amplitude control circuit is integrated in the oscillator. The oscillation amplitude control circuit controls the excitation energy, in other words the current flux through a heating resistance as a function of a threshold value and the amplitudes of the observed real oscillation. Another example in which the oscillation amplitude is limited is described in patent SU 493 770 A awarded to KAUN POLY. In this patent, the vibration amplitude is captured. When the vibration amplitude exceeds a predetermined threshold, a means changes the stiffness of an elastic system such that the resonant frequency is changed and therefore the vibration amplitude is limited. Known examples of mechanical structures comprising an oscillating moving mass will now be described with reference to FIGS. 1A to 1D. Identical reference numbers in these figures denote elements with the same functions.

FIG. 1A represents a mechanical structure 1 incorporating a fixed frame 2 within which a moving mass 3 oscillates. The moving mass 3 is connected to the fixed frame 2 through beams 4 and 5. The movement direction represented by a double arrow 10 is perpendicular to beams 4, 5 and is located in the XOY plane in the figure. The movement of the moving mass is parallel to the OY direction. End 11 of the beam 4 is connected to the moving mass 3, and end 12 is connected to an anchor point 8 fixed in the OY direction of the movement of the moving mass. Similarly, end 13 of beam 5 is connected to the moving mass and end 14 is connected to an anchor point 9 fixed in the OY direction. FIG. 1B shows a mechanical structure 1 comprising a moving mass 3 as shown in FIG. 1A, but in the case in FIG. 1B, the moving mass 3 is connected through a set of four beams to the anchors 8 and 9 respectively, therefore there are two additional beams 6, 7 with ends 15, 16; 17, 18 respectively, these beams coupling the moving mass 3 to anchors 8 and 9 respectively. FIGS. 1C and 1D also show a mechanical structure 1 incorporating a moving mass 3 in which the beams connecting the moving mass 3 to anchor points 8, 9 respectively are not straight beams. The shape of the beams 4, 5 or 6, 7 shown in FIGS. 1C and 1D enables deformation of the beam in the XOY plane and consequently larger vibration amplitudes of the moving mass 3. This larger vibration amplitude of the moving mass 3 is made without non-linear phenomena occurring, precisely due to the shape of beams 4, 5, 6 or 7. This type of deformable beam, that for example can be found in patent application WO 95/34798 assigned to BOSCH, has the disadvantage that it has a moving mass 3 that oscillates not only in the Y direction in the XOY plane, but also in the X direction of the XOY plane. The result is parasite phenomena that disturb the signal that can be produced by such a device, and particularly a sensor with this type of mechanical structure. For example, these parasite phenomena can produce a shift in the resonant frequency by the occurrence of mechanical deformation modes that can be combined with the required excitation mode in the Y direction and finally by increased sensitivity to accelerations along several axes. In the latter case, the result is a reduced control over the directivity of the movement.

The problem of dependence between the vibration amplitude of the oscillating mass and the vibration frequency of this mass is discussed in patent U.S. Pat. No. 5,902,012 awarded to BOEING NORTH AMERICAN.

This patent (column 1, lines 44–48) describes that the vibration amplitude may be as high as 20% of the length of the suspension beams supporting the oscillating mass, and that the elongation of the beams in their axial direction can no longer be ignored under these conditions. To overcome this fact, this patent (column 1, line 63–column 2, line 2) proposes to make the suspension beam more easily extendible, and to do this by modifying the beam or the configuration of the frame or the mass at the location at which this suspension beam is attached.

This better extendibility is obtained either by:
  forming each suspension beam with a curved shape in the plane of vibration of the oscillating mass as shown in FIG. 1 in this patent; or by providing parts to enable relaxation of the elongation stress, for example in the form of cut-outs made at the connections between the beam and the fixed frame and/or the oscillating mass, or in the form of cut-outs made on the elongation beam as shown in FIGS. 2 to 5 in this patent.

Note that in all the examples given, the elongation means are symmetrical with respect to the stiffness. This means that the value of the resistance to elongation is the same for the same value of the tension applied along each direction of the axial line of the suspension beam. In other words, the deformation of the elongation means is the same regardless of whether the tension is made in one direction or in the opposite direction.

BRIEF DESCRIPTION OF THE INVENTION

The invention is intended to provide a mechanical structure in which the oscillating moving mass moves along a known axis without moving in other directions, and according to a linear movement without any of the instabilities that can be observed when the movement is not linear. The invention is intended to offer this linear movement with a greater oscillation amplitude than the oscillation amplitude that could be obtained with mechanical structures according to prior art, for example as described in FIGS. 1A and 1B or in Boeing U.S. Pat. No. 5,920,012. Measurement sensors with improved performances can then be made due to conservation of movement linearity and a larger oscillation amplitude.

Finally, the invention is intended to provide a mechanical structure in which the movement of the vibrating mass is not sensitive or is only slightly sensitive to accelerations or shocks along an axis perpendicular to the movement direction of the moving mass.

As described above, it is known that linear mechanics are no longer applicable when the stiffness of the beams supporting the moving mass varies as a function of the displacement amplitude. This phenomenon is known in mechanics and for example is explained in GW Van SANTEL, "vibration mécanique" (mechanical vibration), Philipps technical library, Dunod Paris, 1957. Other references also describe this phenomenon such as Muck-G, Muller-G, Kupke-W, Nave-P, Seidel-H, "Observation of non linear effect in the resonance behaviour of a micro-machined silicon accelerometer"; and Pavena-R, Gotchev-D, "Non linear vibration behaviour of thin multilayer diaphragms". In order to obtain a linear movement, and therefore with no variation in the stiffness but in a single direction only, the inventors considered separating the suspension function from the stress relaxation function. According to the invention, the stress relaxation function is obtained by means distinct from the main beams such as 4, 5, 6 or 7 that support the suspension function. Therefore these means that support the stress relaxation function make it possible to increase the oscillation amplitude without introducing degrees of freedom that could modify the other properties, and particularly the oscillation frequency. Furthermore, these means make it possible to reduce the disturbance applied to the movement of the oscillating moving mass by an acceleration or a shock along a direction perpendicular to the movement direction of the moving mass. The principle of the invention is that the movement of the moving mass exerts an elongation or compression type stress on the beam(s) that connect the moving mass to the anchor points. This change in stresses causes a variation in the stiffness of the connecting beams. This phenomenon is not very visible in the case of free built in beams as long as the free end has the degree of freedom necessary to keep the stiffness of the beam(s) constant during the oscillation. However, it is very important in the frequent case of built in-built in beams like those shown in FIGS. 1A to 1B. The stress relaxation means according to the invention comprises at least one beam for which the geometric section, length and curvature are calculated so as to cancel the variation of the stiffness in a main beam during oscillation of the moving mass, and secondly to add asymmetry to the response of the stress relaxation means of the suspension beam. This means that, unlike elongation means described in patents U.S. Pat. No. 5,920,012 mentioned above, the apparent stiffness of the suspension means, including the suspension beam and its elongation means, will be asymmetric. This means that the apparent stiffness of the suspension means will be modified differently depending on the direction of the force exerted along the axial line of the suspension beam. In other words, the deformation of the elongation means will be different for two forces with the same absolute value but exerted in opposite directions. Ideally, the apparent variation of the stiffness will be zero when the force is applied in one direction and will be large when the same force is applied in the opposite direction.

Due to this asymmetry of the stiffness response of the elongation means, a sensor equipped with the invention may be made less sensitive to an acceleration along the axial line of the suspension means.

In one example embodiment that will be commented in more detail later, the stress relaxation means is in the form of a beam. This beam is fixed by means of an anchorage at two points. These two points define a straight line perpendicular to an axial direction of the suspension means. An axial line of the stress relaxation means is in the form of a curve that is symmetrical about the axial direction of the suspension means mechanically connected to this stress relaxation beam such that this curve is in the form of two half parts that are symmetrical to each other. This curve forms a hollow, in which the low point coincides with the junction point between the suspension beam and the stress relaxation beam. Each symmetrical half part has a point of inflection.

When the moving mass moves away from its rest position, the suspension means exerts tension on the stress relaxation beam. Since the shape of this beam forms a hollow and a double point of inflection under the effect of the tension applied to the bottom of the hollow, the beam tends to flatten and therefore reduce its length such that it is acting in compression. The result is that the stress relaxation beam according to the invention always works in compression during oscillating movements of the moving mass.

If the suspension beam is subjected to an acceleration with a component along the axial direction of the beam such that a force along this axial direction is exerted on the bottom of the stress relaxation beam approximately perpendicular to this beam, this force tends to increase the depth of the hollow formed by this beam, and this beam will act in tension. The inventors have noted that with this shape, the apparent stiffness of the stress relaxation beam acting in tension is greater than the stiffness of the same beam acting in compression.

The inventors make use of this asymmetry of the apparent stiffness depending on whether the stress relaxation beam is acting in tension or compression, to make the suspension insensitive or at least less sensitive to accelerations along the axial direction of the suspension beam acting in a direction tending to increase the depth of the hollow in the stress relaxation beam. If it is also required to make the suspension insensitive or at least less sensitive to accelerations also applied in a direction opposite to the first direction, the oscillating mass could be suspended by using two stress relaxation beams symmetric to each other about an axis perpendicular to the axial direction of the suspension means. The means that will subsequently be referred to as "elongation means" is connected to the main beam that forms a "suspension element", at least one of its two ends, in which case it forms the link between the said suspension element and the anchor and/or the moving mass. The elongation means may also be connected to the suspension element at a partition of this element, for example if an elongation means is composed of several beams. According to the invention, the deformation of the elongation means will result in an elongation of the dimension of the main beam and the elongation means as a function of the amplitude of the oscillation. This deformation is applied under the influence of the tension applied by the main beam on the elongation means. This tension force is such that the stress exerted in the main beam remains approximately constant.

In summary, the invention is related to a mechanical structure building in a moving mass along an OY axis, this moving mass being suspended by suspension elements mechanically connected firstly to the moving mass and secondly to fixed anchor means, the structure comprising an elongation means mechanically connected to each suspension element inserted between the anchor means and the moving mass, this means forming an improved suspension means with the suspension element, with a first end connected to the anchor means and a second end connected to the moving mass, the elongation means being deformable in an XOY plane, the direction OX being the direction connecting the first end to the second end of the improved suspension means, structure characterised in that the stiffness of the elongation means is asymmetric, and with the improved suspension means an applied force causes a lower apparent stiffness variation when it is exerted in one direction along the OX axis than when the same force is applied in the opposite direction.

The shape of a mechanical means satisfying this asymmetry condition can be calculated using a digital simulation with the finite elements method, for example using the ANSYS software. The asymmetry condition may induce asymmetry in the shape of the mechanical means, or in a variation of its width or thickness or a combination of these three asymmetries.

According to one example embodiment that will be described briefly below and in more detail later, at least one of the elongation means is in the form of at least one beam with two ends and an axial line with a hollow with a bottom, this beam being symmetrical with respect to an axis of the suspension element that is connected to it, such that the said axial line is in the form of two half parts symmetrical to each other, each half part having a point of inflection.

Ideally, the deformation of the elongation means must be such that the stiffness of the improved suspension means in the suspension element remains constant. This means that the tension or compression force generated by the movement of the moving mass in the suspension element remains constant. There are at least two ends to the elongation means itself.

As described above, the suspension element is always mechanically coupled to the point of symmetry, which is therefore the mid-point of the suspension element.

An elongation means may be composed of one or several elongation beams, preferably identical and parallel to each other.

A suspension element may be coupled to an elongation beam at only one of its ends, in which case this elongation beam forms the elongation means, and the elongation means then has two ends that may be connected either to the anchor means or to the moving mass. A suspension element may also be coupled to an elongation beam at each of its ends, in which case these elongation beams form the entire elongation means. In this case, the two ends of a first elongation beam are mechanically connected to the anchor means and the two ends of the other elongation beam are connected to the moving mass.

Finally, the elongation means may comprise a first group of beams in which the hollows are oriented in the same direction.

Preferably, the beams in this group are identical and parallel to each other. Each beam in the group is connected to the suspension element, and the two ends of each of these beams in the first group are connected to the anchor means or to the oscillating mass.

In one advantageous embodiment of the invention, the elongation beam has a straight part forming the bottom of the hollow formed by the beam.

BRIEF DESCRIPTION OF THE DRAWINGS

Non-limitative examples of embodiments of the invention will now be described with reference to the attached drawings in which.

Figure 5:
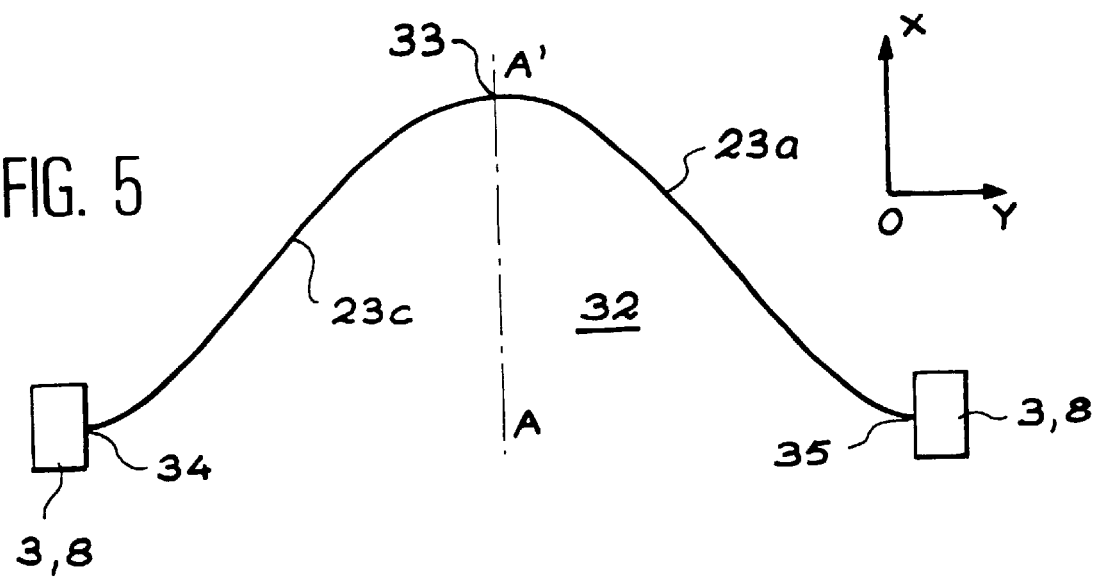
Figure 6:
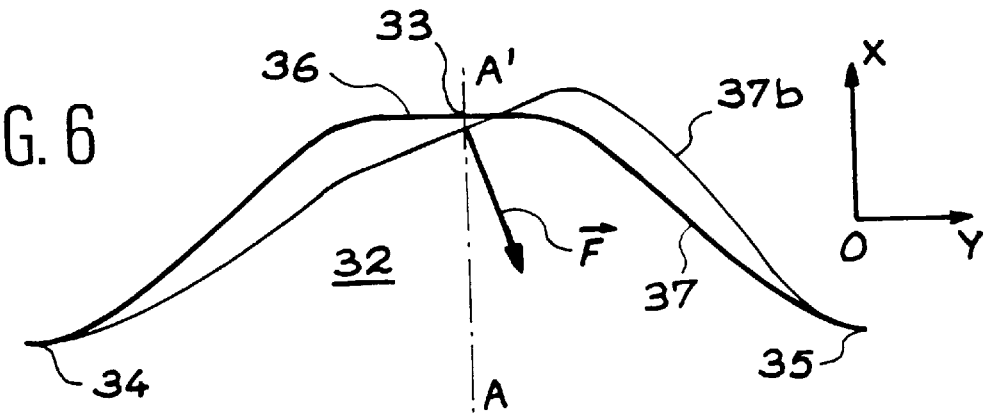
Figure 8:
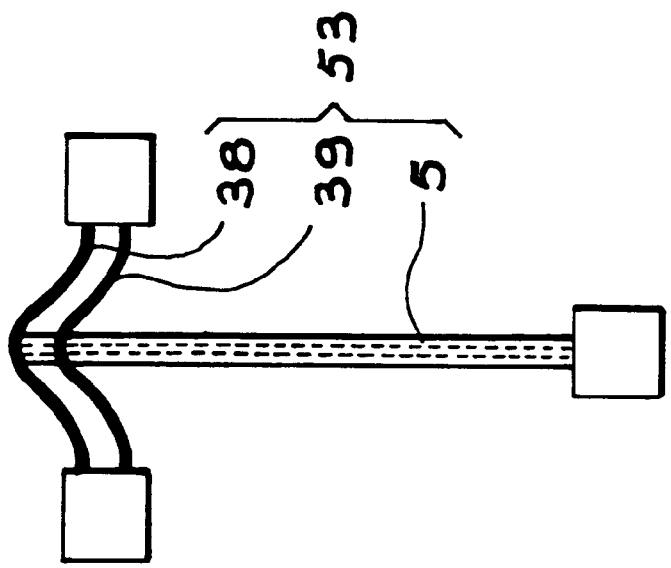
Figure 7:
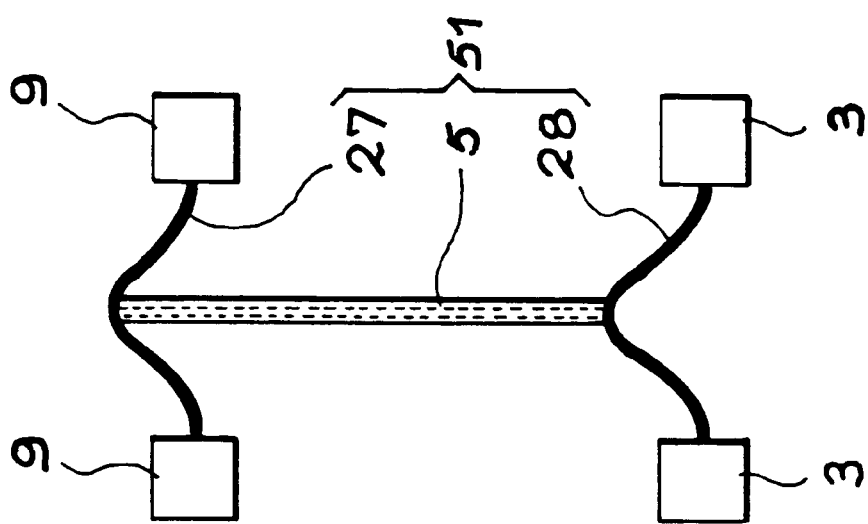
Figure 9:
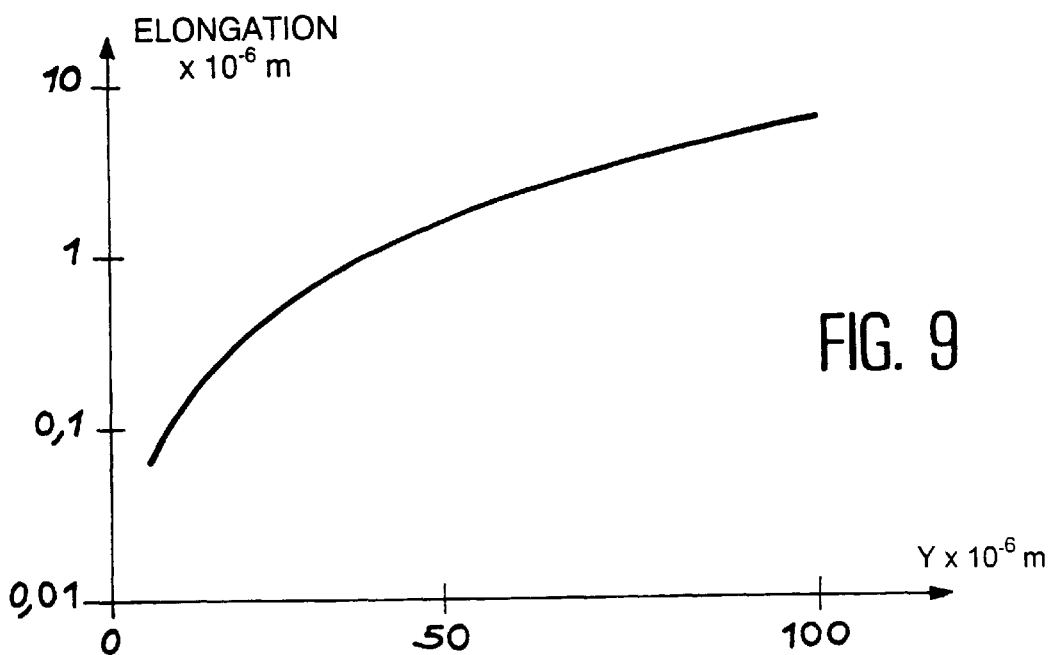
Figure 10:
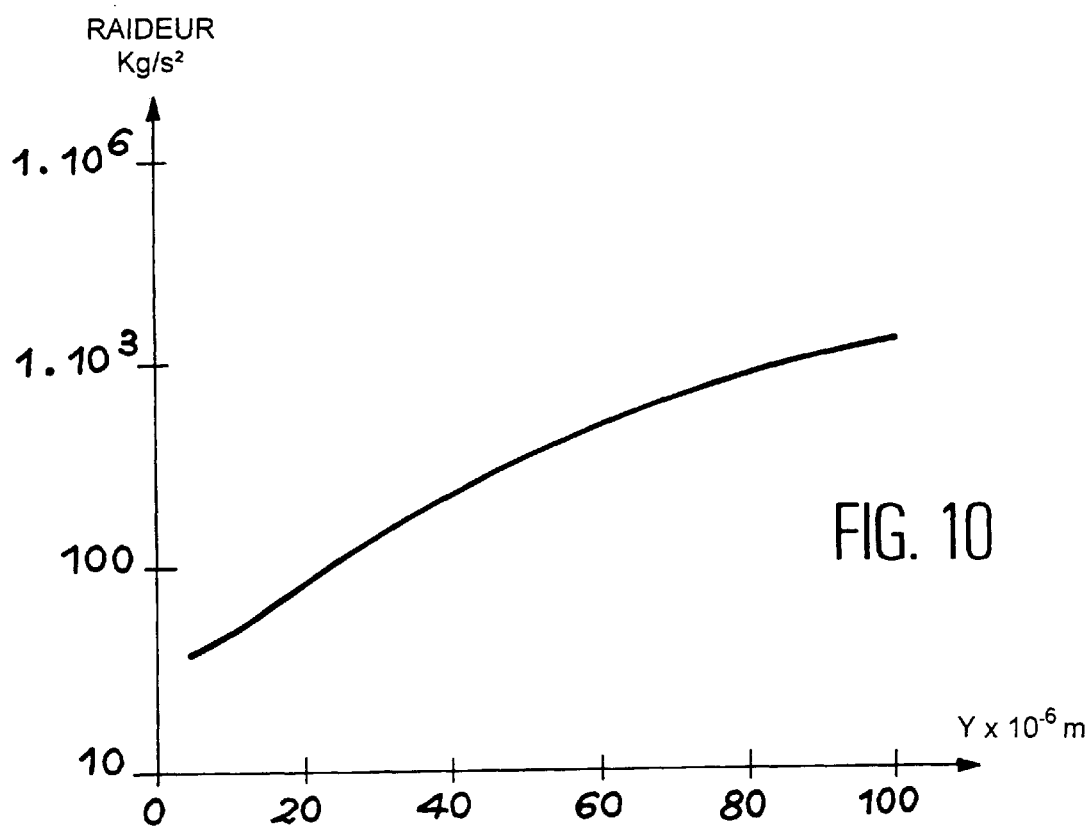

when there is no stress exerted at its centre by a suspension element;

when there is a tension present exerted at its centre by a suspension element, this tension being exerted along the direction in which it tends to reduce the depth of the hollow;

FIG. 5 shows the axial lines of an elongation beam;

when there is no stress exerted at its centre by a suspension element;

when there is a thrust exerted at its centre on the bottom of the hollow by a suspension element;

FIG. 6 shows a particularly advantageous shape of the axial line of an elongation beam and deformations of this shape under the effect of stress;

FIGS. 7 and 8 show examples of the use of elongation beams to form improved suspension means;

FIGS. 9 and 10 are curves illustrating calculation methods for the elongation means.

In these figures, elements with the same functions as elements already described in FIG. 1 are assigned the same reference numbers as in FIG. 1.

DESCRIPTION OF THE PREFERRED EMBODIMENTS

Figure 1A:
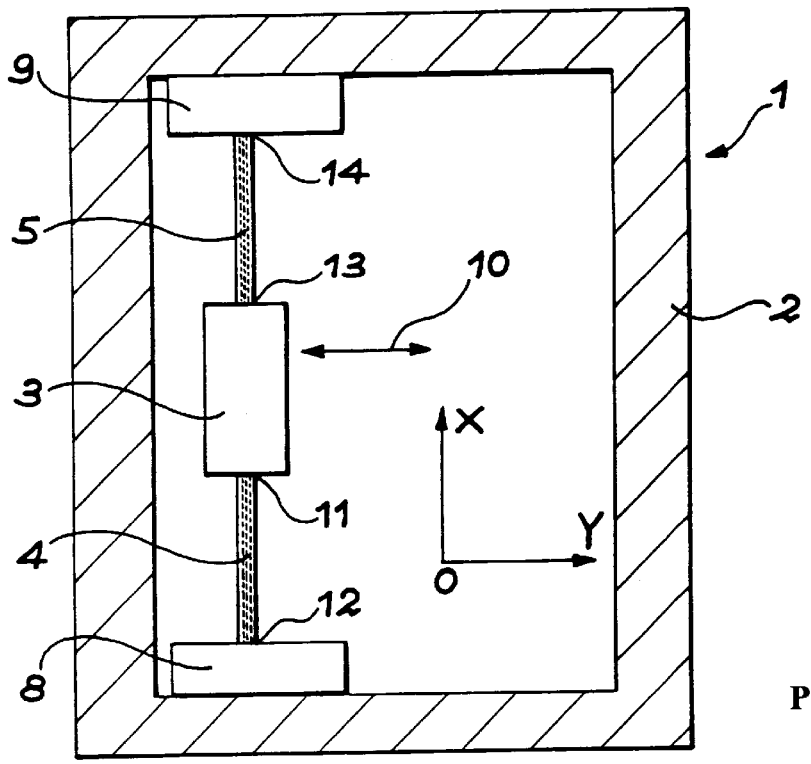
FIGS. 1A to 1D mentioned above show example embodiments of a mechanical structure comprising a moving mass according to prior art.
Figure 1B:
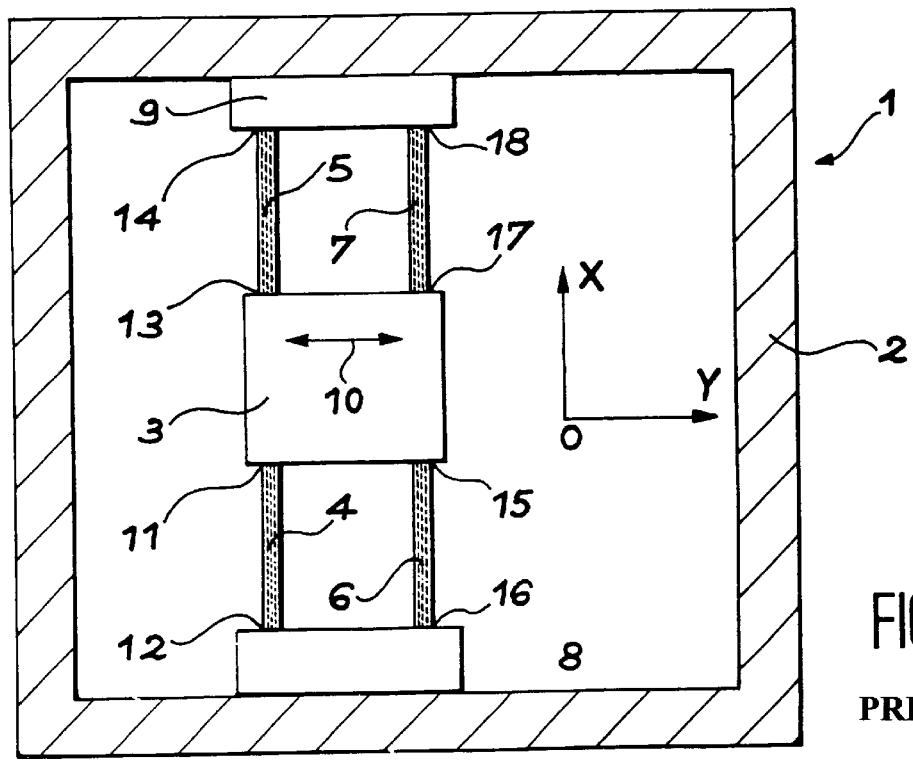
Figure 1C:
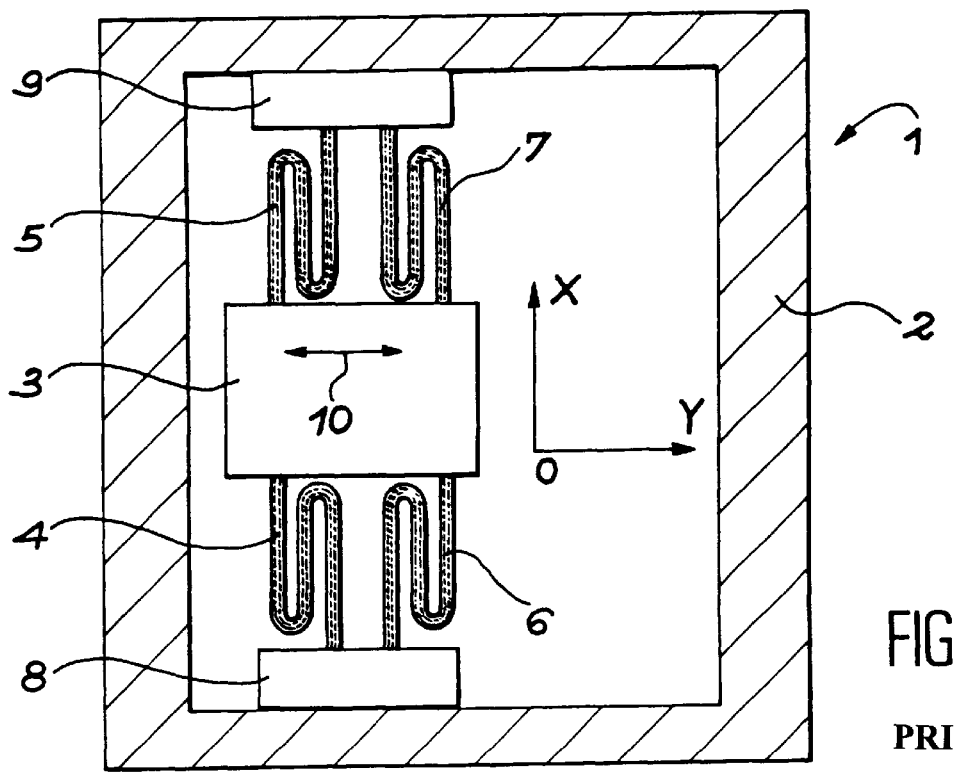
Figure 1D:
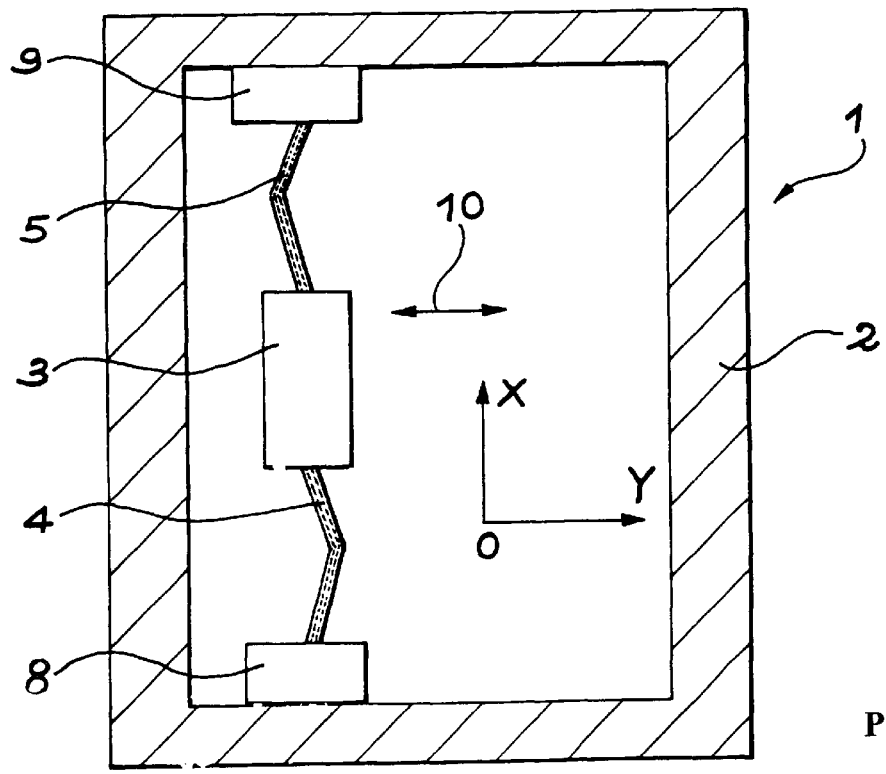
Figure 2:
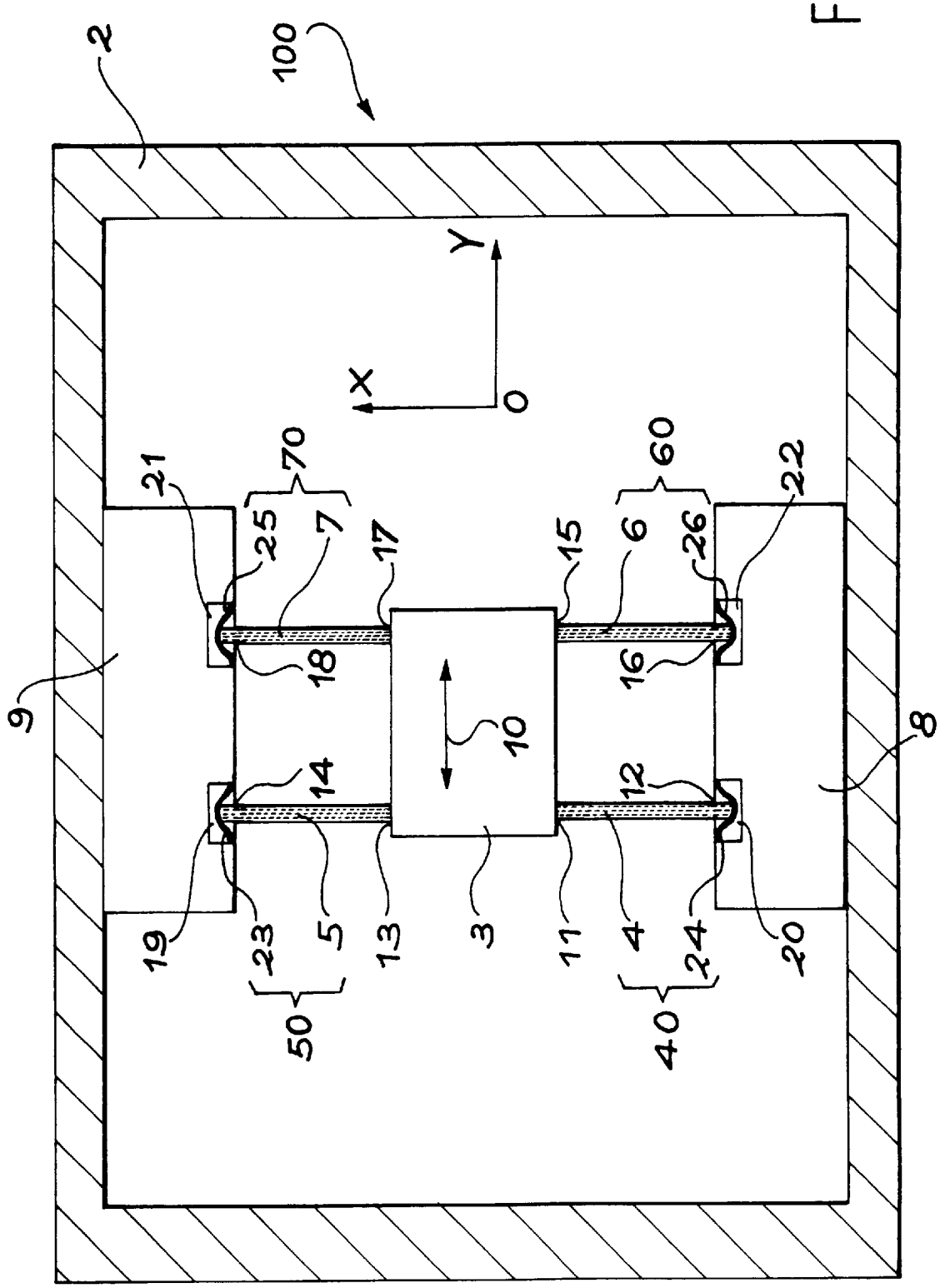
FIGS. 2 and 3 show embodiments of the invention.
Figure 3:
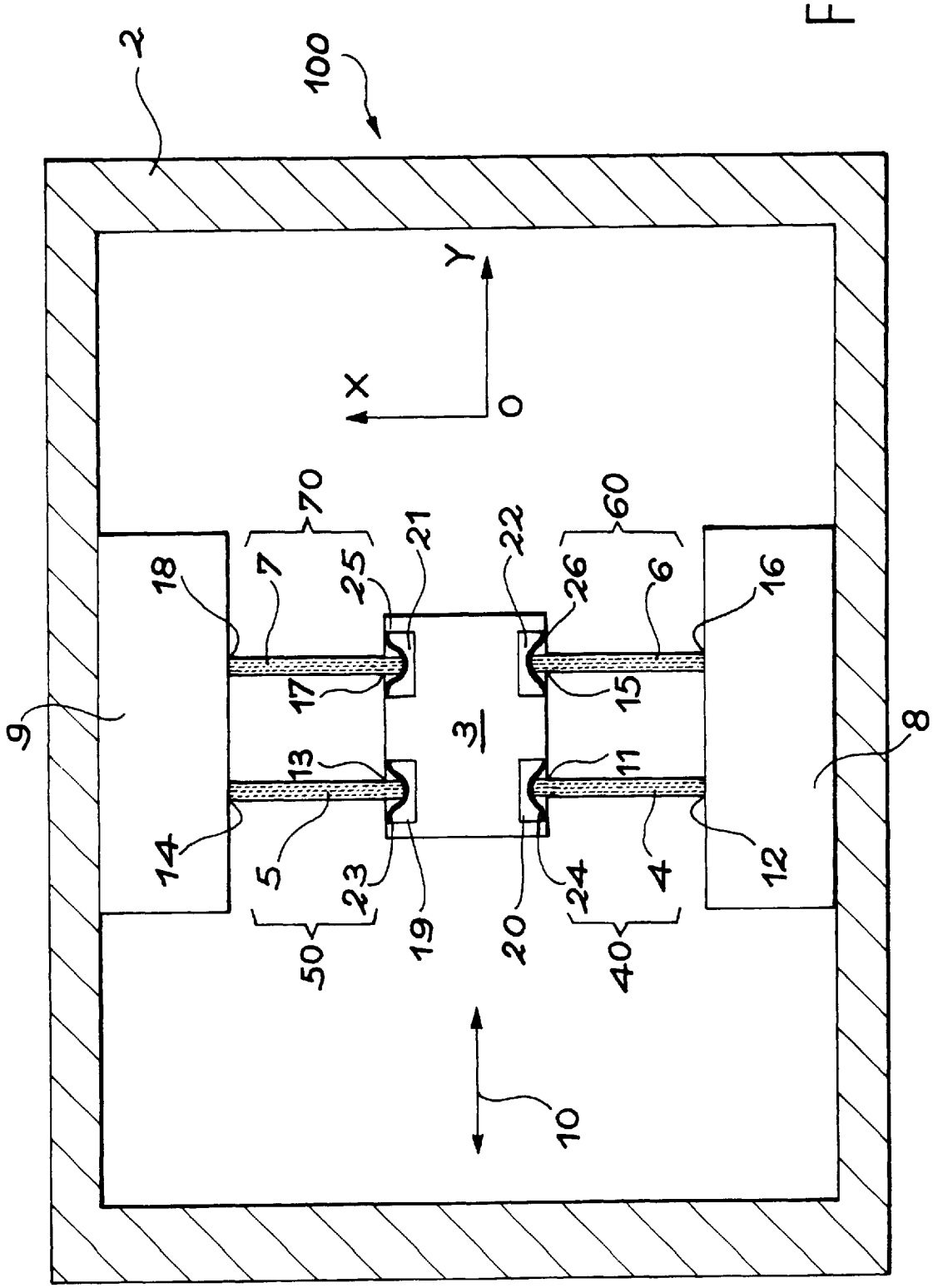

FIGS. 2 and 3 show a mechanical structure comprising a moving mass 3, like that described for example with reference to FIG. 1B. Examples of mechanical structures 100 shown in FIG. 2 are different from the example in prior art shown in FIG. 1B due to the addition of the elongation means 23, 25 in the anchor element 9, and 24, 26 in the anchor element 8. On the other hand, the elongation means 23, 25 and 24, 26 in FIG. 3 are incorporated in the moving mass 3. The elongation means 23 to 26 are built into recesses 19, 21 in anchor 9, and into recesses 20, 22 in anchor 8 for FIG. 2. These same recesses 19 to 22 are formed in the moving mass 3 in FIG. 3. The elongation means in FIGS. 2 and 3 are in the form of a small beam 23 to 26. There are two ends to each of these beams, and the ends of these beams are mechanically connected to the edges of the recesses 19 to 22 in which they are housed. The deformations of these beams 23–26 in the XOY plane in which the moving mass 3 moves, enable displacement of the moving mass without increasing the stress present in the beams 4 to 7, and therefore enable a linear movement of the moving mass 3 as a function of the excitation. In the cases shown in FIGS. 2 and 3, the elongation means 23 to 26 are located at the end of the suspension elements 4 to 7 located either at the anchors 8 and 9 (FIG. 2) or at the moving mass 3 (FIG. 3). There is no difference in the calculation of the length and the cross-section of elongation means 23 to 26 if this means is fixed in a recess at one of the anchor masses 8 or 9, or at the moving mass 3. In general, additional considerations about the dimensions of the moving mass 3 or the anchor points 8 and 9 will mean that these elongation means 23 to 26 are installed at anchor masses.

In FIGS. 2 and 3, the suspension element 5 and the elongation means 23 combine to form an improved suspension means 50. Similarly, the elements 7–25, 4–24 and 6–26 form improved suspension means 70, 40 and 60 respectively. The ends of the improved suspension means 40, 50, 60 and 70 are made up as follows.

In FIG. 2, the ends of the improved suspension means 50 are composed firstly of the end 13 of the suspension element 5 connected to the moving mass 3, and secondly by the ends of the elongation means 23 connected to the recess 19. The same is true for the three other improved suspension means 40, 60 and 70, one of the ends of each of these improved suspension means consisting of one end of a suspension element, for example 17 for the suspension element 7, 11 for the suspension element 4, and 15 for the suspension element 6. The other end of the improved suspension means 70 is composed of the ends of the elongation means 25. The same is true for the improved suspension means 40 and 60.

The shape and deformations of the elongation means according to the invention will now be described in more detail with relation to FIGS. 4 to 6.

These figures all represent axial lines of elongation beams, for example 23, 25 as shown in FIG. 2.

An axial line refers to a line located at an equal distance from each side of the beam. Since the beam is long and thin, the shape of the axial line is representative of the curvatures of this beam.

These lines are represented in the XOY plane of displacement of the moving mass 3, as shown by the axes in FIGS. 2 and 3. These axes are also shown in FIGS. 4 to 6. Reference 23 is assigned to each of the curves represented in FIGS. 4 to 6, for example thus indicating that it is the axial line of beam 23 housed in the recess 19 in FIG. 2.

Each of the curves delimits a hollow 32, in this example facing the negative X direction. Each curve 23 has an axis of symmetry AA' parallel to the OX axis, the bottom 33 of the hollow 32 being located on this axis of symmetry such that a tangent to the curve 23 at the bottom of the hollow is parallel to the displacement axis OY of the oscillating mass 3. The tangent at the ends 34, 35 of the beam 23 is parallel to the OY direction in this example. The angle of this tangent with the OY direction may be between 0 and 45°.

Therefore there is a point of inflection on the curve 23 between the bottom of the hollow 33 and each of the end points 34, 35. FIG. 4 shows a first axial line 23a that is the shape of the beam 23 when there is no force applied along a direction perpendicular to the tangent to the bottom 33 of hollow 32.

Figure 4:
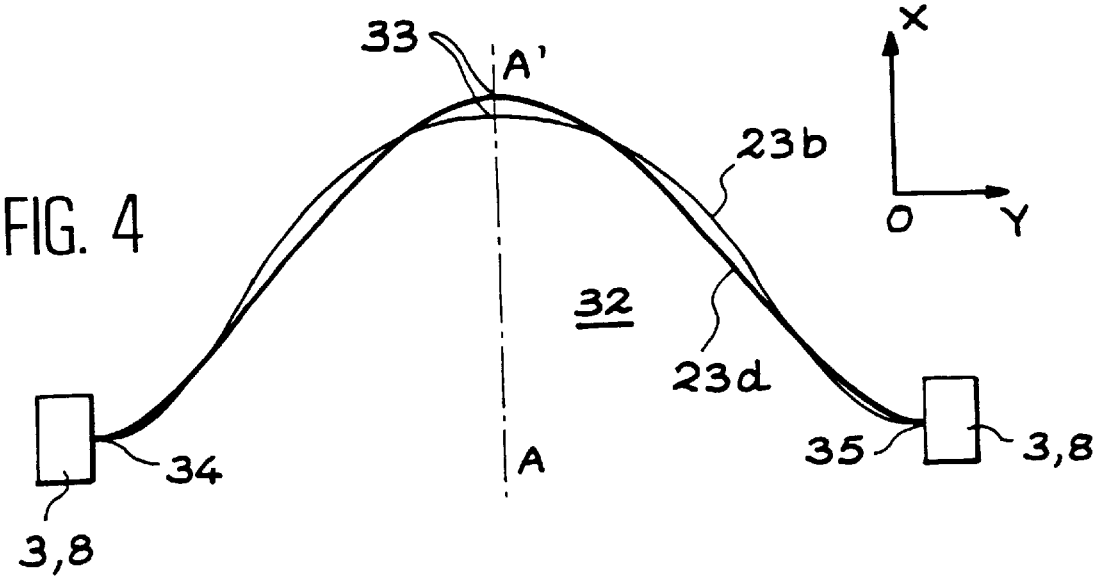
FIG. 4 shows the axial lines of an elongation beam.

It also shows a second axial line 23b that is the shape of the curve 23 when tension is applied on the bottom 33 of the hollow 32 by beam 5 along the direction of the X axis and, in the case shown in FIG. 4, along the negative X direction. The hollow of the curve 23b is not as deep as the hollow in curve 23a.

The difference in depth is clearly perceptible, however since the end points 34, 35 that are the anchor points are the same, the curve 23b is more convex than curve 23a between the point 33 and each of the points 34, 35. Beam 33 acts in compression when tension is applied on the bottom 33 of the hollow along the direction of the arrow.

FIG. 5 also shows two axial lines 23a and 23c. As in FIG. 4, curve 23a shows the shape of the beam 23 when no force is applied on the bottom of the hollow. Curve 23c represents the same shape when a force with a magnitude equal to the force that caused the deformation that moved from curve 23a to curve 23b but in the opposite direction, is applied to the bottom 33 of the hollow. This force is shown in FIG. 5 along the positive X direction.

FIG. 5 shows that the curves 23a and 23c are practically coincident with each other to the extent that they only form a single thick line. When a force tending to increase the depth of the hollow is exerted on the bottom of the hollow, as shown in FIG. 5, the beam acts in tension.

The fact that a force that is sufficient to significantly deform the beam when the beam is acting in compression, is insufficient to produce any perceptible deformation when the same beam is acting in tension, is due to the difference in the apparent stiffness of the beam 23 when it is acting in compression and when it is acting in tension.

The result is that if an acceleration or shock is exerted on the structure resulting in a force with a component along the negative X direction, this force will not cause any deformation of the suspension, or will only cause a small deformation. The result is that a sensor equipped with this type of structure will be insensitive to accelerations inducing forces applied along the positive X direction.

If the oscillating mass 3 is suspended by at least two elements 4, 5 symmetrical with each other about a direction parallel to the OY axis, as shown in FIGS. 2 and 3, and if the corresponding elongation beams 23, 24 are also symmetrical with each other about this same axis, then a force exerted along the OX direction will be exerted on one of the beams 23 or 24 to make it act in tension, regardless of the direction of the force.

Thus, in the embodiment shown in FIG. 2 or 3, the beams 23–26 act in compression when the moving mass 3 moves along the OY direction. Two of the beams 23–26 act in tension when an acceleration is applied to structure 100 along OX.

One advantageous shape of the elongation beam will now be commented upon with reference to FIG. 6. This figure represents an axial line 37 along an elongation beam, for example such as beam 23. This beam has the same characteristics, particularly an asymmetric response to tension or compression, as the characteristics mentioned in the description of the axial line 23a. It is particular in that it has a flat hollow bottom 32. The result on the axial line 37 is that the axial line includes a straight segment 36 in the middle. The ends 34, 35 are symmetrical with each other about the axial line of the beam, for example 5.

This structure has the advantage that the segment 36 is free to pivot almost freely about an axis OZ perpendicular to the XOY plane at the intersection point 33 between the axial line of the beam 23 and its axis of symmetry AA'. This pivoting about the point is illustrated by the curve 37b that illustrates the shape of the axial line when the beam is acted upon by the moving mass when this mass has moved away from its rest position. This load is shown by an arrow $\vec{F}$.

In FIGS. 2 and 3, the shape of each of the elongation means 23, 26 is as shown by the curve 23a, FIG. 4, or advantageously 37, FIG. 6. In these figures, the elongation means 23–26 is on anchors 8, 9 (FIG. 2) or on the moving mass 3 (FIG. 3).

Other examples of use of elongation means with the shape described with relation to FIG. 4 or FIG. 6 will now be described with reference to FIGS. 7 and 8.

In FIGS. 7 and 8, only the improved suspension element 50 has been shown in a modified form with reference 51 in FIG. 7, and 53 in FIG. 8, for simplification reasons. It should be understood that the improved suspension means 40 is made in the same way or symmetrically about an axis parallel to OY. Similarly, if the suspension comprises four improved suspension means, the means 60 and 70 are built in the same way or symmetrically to each other about an axis parallel to OY.

In FIGS. 7 and 8, references 3 showing the oscillating mass and 9 showing the anchor have been marked on squares symbolising these elements.

However, note that these references 3 and 9, and therefore the corresponding elements, could be interchanged without modifying the operation of the structure 100.

In FIG. 7, the improved suspension means 51 is composed of the suspension beam 5 and two elongation beams 27, 28. The two ends of the beam 27 are mechanically connected to anchor 9. The two ends of the beam 28 are mechanically connected to the oscillating mass 3. In the embodiment shown in FIG. 7, the hollows of the elongation beams 27, 28 are facing the same side and one of the ends of the suspension beam 5 is connected to the bottom of the hollow of the elongation beam 27 at one end, and the other end is connected to the top of the hump forming the side opposite the hollow in the elongation beam. Another embodiment is to turn the hollow of the elongation beam to the other side.

In FIG. 8, the improved suspension means 53 is composed of the suspension beam 5 and several elongation beams, for example the ends of which are connected to the anchor. In the example shown in FIG. 8, there are two beams 38 and 39. The mid-point of one of the elongation beams is connected to one end of the suspension beam 5. The mid-point of the second elongation beam 39, and possibly additional beams, is connected between the two ends of the suspension beam 5.

Considering everything mentioned above about possible symmetries and similarities, it should be understood that this type of configuration with several elongation beams at one end can be used as in the cases described with relation to FIGS. 2, 3 and 7, a set of several beams replacing at least one of the single beams 23–30. Thus, a first group of beams such as beams 38, 39 shown for example in FIG. 8 can replace each of the single elongation beams such as 27 shown in FIG. 7. An improved suspension means like means 51 can also comprise a second group of beams, for example these groups having the same shape and the same orientation of the hollow as the beam 28 shown in FIG. 7.

In all example embodiments shown in FIGS. 2, 3 and 7, 8, the elongation means 23–28 and 38, 39 are similar in that they are deformable considering the forces applied to them in the XOY plane defined firstly by the direction of movements of the moving mass 3, and secondly by the direction of the suspension elements 4, 5, 6 and 7. The elongation means 23–28 and 37–39 are capable of relieving stresses induced in the suspension elements such as element 4 without disturbing the movement characteristics of the moving mass, for displacements much greater than the displacements possible without this means. The elongation means 23–28 and 36, 38, 39 does not introduce a parasite mode close to system resonance. It hardly disturbs the natural frequency of the movement; the additional degree of freedom introduced by the elongation means is efficient in that it only adds a very small amount of flexibility into the complete system. It should be understood that the stress relaxation means in the form of elongation means 23–28 and 37–39 must be added to each of the beams to which a stress is applied during displacement of a moving mass in the complete system. Non-linearities are significantly reduced and the limit to the amplitude of the movement of the moving mass for which linearity is maintained is then reduced. The invention can increase the movement amplitude of the moving mass by several orders of magnitude. The geometry of the beams(s) forming the elongation means may be various, for example a constant rectangular or round section along the entire length of the beam, the asymmetry of the stiffness being introduced as in the examples commented upon with reference to FIGS. 2 to 8 by the shape of the axial line. As described above, this stiffness asymmetry may also be achieved by variations in the shape of the straight section of the elongation means between its first and second ends. The elongation means according to the invention also have the advantage that they are insensitive to accelerations perpendicular to the movement of oscillating mass.

We will now describe the procedure to be followed to determine the size of the elongation means.

The elastic stiffness of the elongation means is calculated so that the deformation of the elongation means during the movement of the moving mass prevents the occurrence of an excessive variation of stiffness in the improved suspension element(s) under the effect of the stress applied to the said suspension element. The first step is to evaluate the effect of the stress induced in each of the suspension elements supporting the moving mass during the oscillation movement of this mass when no elongation means is used. This stress is easily calculated by applying conventional strength of materials relations and depends on the geometry of the suspension elements.

FIG. 9 shows the variation of the deformation of the beam making up the suspension element along the X axis as a function of the oscillation amplitude along the Y axis, for the case of a beam with a rectangular cross-section and of the built in-built in type forming a suspension element for a moving mass oscillating along the Y axis. The oscillation amplitude of the moving mass is shown on the abscissa, while the elongation of the suspension means expressed in $\mu$m is shown on the ordinate. FIG. 10 shows the variation of the equivalent stiffness of a beam that is non-deformable along its length (X direction) and without any elongation means, as a function of the value of the deformation. The abscissa represents the amplitude of the oscillation and the ordinate represents the stiffness expressed in $Kg/s^2$. The stiffness of the elongation means is determined such that its deformation is comparable to the value of the elongation as determined and shown on the curve in FIG. 9. Once again, these calculations of the value of the stiffness are based on conventional strength of materials equations. The sizing of the elongation means must also take account of the fact that the deformation of this means must remains such that it does not cause any important variation in the stiffness of the means. This is a limitation to the capacity of the elongation mean to enable even greater oscillation amplitudes of the moving mass. In the special case shown in FIG. 1A or 1B in which the suspension is composed of one or several built in-built in type beams in the absence of the elongation means, the equation of motion for the moving mass may be expressed in the following well known general form:

$$\frac{d_2Y}{dt_2} + 2\ddot{e}\frac{dY}{dt} + \omega_0^2 Y + \hat{a}Y_2 + \hat{a}Y_3 = F_0 \sin\hat{u}t$$

In this equation, Y is the elongation of the movement of the moving mass, t is the time, λ is a damping coefficient, $\omega_0$ is the resonant frequency and α and β are non-linearity coefficients. $F_0$ is the applied force. The coefficients α and β are chosen such that $\alpha Y_{max}$ is very much less than $\omega_0^2$ and $\beta Y_{max}^2$ is very much less than $\omega_0^2$. In a known manner, a movement with this equation becomes unstable when the movement amplitude exceeds the limiting value given by the following formula:

$$Y_l^2 = \frac{32}{9\sqrt{3}} \cdot \frac{\hat{u}_0^2}{|\hat{a}|Q}$$

In this equation, Yl is the limiting value of the oscillation amplitude and Q is equal to $$\frac{\hat{u}_0}{2\ddot{e}}.$$

Q is the mechanical quality factor for the structure. If it is required to make the equation of motion of the moving mass linear, an elongation means needs to be added such that the coefficients α and β in the equation will become zero or very small. The coefficient α may be considered as being negligible, therefore an attempt will be made to minimise the coefficient β. The coefficient β for the improved suspension means composed firstly of the suspension means and secondly of the elongation means, should be as small as possible. For the examples shown in FIG. 2, 3 or 7, 8 in which the cross section of the beams is rectangular and of the built in-built type, the value of the coefficient β of the equivalent beam formed by the elongation means and the suspension means is proportional to $$\frac{WH}{L^3},$$

where W, H and L are the width, depth and length of the equivalent beam from which the moving mass is suspended. When the moving mass is supported by several beams, conventional superposition rules are applied to determine the equivalent beam. In the examples of embodiments like those shown in FIGS. 2, 3 and 7, 8, the elongation means is in the form of a single beam with its two ends connected to a mechanical element that may be considered as being fixed with respect to the movement of the moving mass. This mechanical element 23 to 28 or 36, 38, 39 is itself connected to the fixed support for this system or to the moving mass. For example, when the suspension element is composed of a main beam for which the length is of the order of 1 mm, this beam only enables an oscillation of the moving element of a few mm when the quality factor Q is high (more than a few hundred), the elongation means used for example at at least one end of each of the main beams may have a cross section equivalent to the cross section of the main beams. A length of the elongation beam equal to a few hundred $\mu$m can result in oscillations of a few tens of $\mu$m, which improves the oscillation amplitude by several orders of magnitude.

The result is that the sensitivity and discrimination of a sensor, for example an accelerometer, a gyrometer, or a pressostat comprising a mechanical structure 100 according to the invention, will be improved.

What is claimed is:

1. Mechanical structure comprising:
   at least a moving mass moving along an OY axis; and
   suspension elements suspending said moving mass and mechanically connected firstly to the moving mass and secondly to a fixed part of the mechanical structure, at least one of the suspension elements including,
   an elongation mechanism inserted between the fixed part and an end of a suspension element opposite the moving mass, connected to the suspension element, co-operating with the suspension element to improve suspension of the moving mass, mechanically connected to the fixed part, and connected through said end of the suspension element to the moving mass, wherein the elongation mechanism is deformable in an XOY plane, a direction OX in the XOY plane being a direction along an axis of the suspension element, a stiffness of the elongation mechanism is asymmetric in that an applied force causes a lower apparent stiffness variation when exerted in one direction along the direction OX than when the same force is applied in an opposite direction.

2. Structure according to claim 1, wherein the elongation mechanism comprises:
   at least one beam having two ends and an axial line therebetween, the axial line upon deformation forming a concave hollow, said hollow having a bottom, the at least one beam being symmetrical with respect to the axis of the suspension element such that the axial line comprises two half parts symmetrical with each other, each half part having a point of inflection.

3. Structure according to claim 2, wherein a tangent to the axial line at each end of the axial line forms an angle of between 0 and 45° with a direction perpendicular to an axis of symmetry of the axial line.

4. Structure according to claim 2, wherein a tangent to the axial line at a point of intersection of the axial line with an axis of symmetry is perpendicular to the axis of symmetry.

5. Structure according to claim 2, wherein at least one elongation mechanism is connected to the fixed part.

6. Structure according to claim 2, wherein at least one elongation mechanism is connected to the moving mass via the suspension elements.

7. Structure according to claim 2, wherein at least one elongation mechanism is connected to the fixed part and is connected to the moving mass via the suspension elements.

8. Structure according to claim 5, wherein at least one elongation mechanism comprises several elongation beams.

9. Structure according to claim 6, wherein at least one elongation mechanism comprises several elongation beams.

10. Structure according to claim 7, wherein at least one elongation mechanism comprises several elongation beams.

11. Structure according to claim 1, wherein the at least one of the suspension elements comprises two suspension mechanisms symmetrical with each other.

12. Structure according to claim 2, wherein the at least one of the suspension elements comprises two suspension mechanisms axially symmetrical with each other.

13. Structure according to claim 1, wherein the at least one of the suspension elements comprises four suspension mechanisms symmetrical with each other in pairs.

14. Structure according to claim 2, wherein said bottom of the concave hollow includes a straight line segment.

15. Device, and particularly a sensor, incorporating a mechanical structure according to any one of claims 1 to 14.

* * * * *